(12) United States Patent
Sanders (10) Patent No.: US 7,068,080 B1
(45) Date of Patent: Jun. 27, 2006

(54) METHOD AND APPARATUS FOR REDUCING POWER CONSUMPTION WITHIN A LOGIC DEVICE

(75) Inventor: Lester S. Sanders, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/347,054

(22) Filed: Jan. 17, 2003

(51) Int. Cl.
*H03K 17/00* (2006.01)

(52) U.S. Cl. .................. 327/99; 327/544; 327/141; 326/93

(58) Field of Classification Search ............ 326/37–41, 326/93, 95, 98; 327/199, 295, 291, 298, 327/403, 404, 407, 99, 544
See application file for complete search history.

(56) References Cited

U.S. PATENT DOCUMENTS

| | | | |
|---|---|---|---|
| 3,976,949 A * | 8/1976 | Hepworth et al. ........... 327/217 |
| 5,811,987 A * | 9/1998 | Ashmore et al. ............. 326/39 |
| 5,818,273 A * | 10/1998 | Orgill et al. ................ 327/199 |
| 5,844,844 A | 12/1998 | Bauer et al. |
| 5,883,529 A * | 3/1999 | Kumata et al. ............... 326/93 |
| 6,072,348 A * | 6/2000 | New et al. ................... 327/295 |
| 6,204,695 B1 | 3/2001 | Alfke et al. |
| 6,348,828 B1 * | 2/2002 | Barnes ........................ 327/298 |
| 6,466,049 B1 * | 10/2002 | Diba et al. ..................... 326/37 |
| 6,472,904 B1 * | 10/2002 | Andrews et al. .............. 326/38 |
| 6,556,043 B1 * | 4/2003 | Garcia ......................... 326/40 |

OTHER PUBLICATIONS

Tomas Lang et al.; "Individual Flip-Flops with Gated Clocks for Low Power Datapaths"; IEEE Transactions on Circuits and Systems-II: Analog and Digital Signal Processing: vol. 44, No., 6; Jun. 1987; pp. 507-516.
A. Gago et al.; "Reduced Implementation of D-Type DET Flip-Flops"; IEEE Journal of Solid-State Circuits; vol. 28, No. 3; Mar. 1993; pp. 400-402.
Antonio G.M. Strollo et al.; "Analysis of Power Dissipation in Double Edge-Triggered Flip-Flops"; IEEE Transactions on Very Large Scale Integration (VLSI) Systems; vol. 8, No. 5; Oct. 2000; pp. 624-629.

* cited by examiner

*Primary Examiner*—Vibol Tan
(74) *Attorney, Agent, or Firm*—W. Eric Webostad; Kim Kanzaki (57) ABSTRACT

Method and apparatus for reducing power consumption within a logic device is described. A logic device comprises a clock gate and a flip-flop. The clock gate includes a clock enable terminal and a clock terminal. The flip-flop includes an input terminal, an output terminal, and a configuration terminal. The flip-flop is coupled to the clock gate. The flip-flop is configurable to trigger on at least one of a rising edge and a falling edge of a clock signal. The clock gate controllably gates the clock signal coupled to the clock terminal.

15 Claims, 7 Drawing Sheets

FIG. 7

METHOD AND APPARATUS FOR REDUCING POWER CONSUMPTION WITHIN A LOGIC DEVICE

FIELD OF THE INVENTION

One or more aspects of the present invention relate generally to digital logic devices and, more particularly, to a method and apparatus for reducing power consumption within a logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Clock signals are used within a PLD to control the timing of events. Each process within a PLD may be clocked by a single distributed clock signal, for example, to provide synchronized processing. In some cases, however, not all processes within a PLD are active at all times. That is, some processes do not require a continuous clock signal. Continuously providing a clock signal to a process that does not require such adds unnecessarily to the power consumption of the PLD. As such, designers typically gate a clock signal coupled to an inactive process to reduce power consumption. The gate circuit is typically formed using logic blocks within the PLD. Such external gating of the clock signal, however, may cause an undesired change in the duty cycle of the clock signal.

In addition, most flip-flops employed within commercially available PLDS are single edge triggered (SET) flip-flops. If dual edge triggered (DET) flip-flops are used, designers employ logic blocks within a PLD to form a DET flip-flop. As is well known in the art, in some instances, a DET flip-flop provides reduced power consumption as compared to an SET flip-flop. In addition to reducing power consumption, DET flip-flops can reduce logic requirements of functions such as data registers and shift registers by approximately 50%. The throughput of certain functions using DET flip-flops may also be higher that an equivalent function using SET flip-flops. In other instances, however, an SET flip-flop provides reduced power consumption over a DET flip-flop.

Accordingly, it would be both desirable and useful to provide a method and apparatus for reducing power consumption in a logic device that overcomes one or more power consumption disadvantages associated with SET and DET flip-flops.

SUMMARY OF THE INVENTION

Method and apparatus for reducing power consumption within a logic device is described. In an embodiment in accordance with one or more aspects of the invention, a logic device comprises a clock gate and a flip-flop. The clock gate includes a clock enable terminal and a clock terminal. The flip-flop includes an input terminal, an output terminal, and a configuration terminal. The flip-flop is coupled to the clock gate. The flip-flop is configurable to trigger on at least one of a rising edge and a falling edge of a clock signal provided to the clock terminal. The clock gate is synchronous with the clock signal. In an embodiment, the clock gate controllably gates the clock signal responsive to a clock enable signal provided to the clock enable terminal. The flip-flop controllably triggers on a selected one of a rising edge, a falling edge, and both the rising edge and the falling edge of the clock signal, responsive to a configuration signal provided to the configuration terminal.

In another embodiment in accordance with one or more aspects of the invention, a programmable logic device (PLD) includes at least one flip-flop disposed in at least one of a plurality of logic blocks within the PLD. The at least one flip-flop includes a gate clock terminal, a data input terminal, a data output terminal, a configuration terminal, and a synchronous clock gate having a clock enable terminal. The flip-flop is configurable to trigger on a selected one of a rising edge, a falling edge, and both the rising edge and the falling edge of the clock signal. The synchronous clock gate controllably gates the clock signal coupled to the gate clock terminal.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

Method and apparatus for reducing power consumption within a logic device is described. One or more aspects in accordance with the invention are described in terms of reducing power consumption within an FPGA. While specific reference is made to reducing power consumption within an FPGA, those skilled in the art will appreciate that one or more aspects of the invention may be used to reduce power consumption in other programmable logic devices, such as a CPLD.

Figure 1:
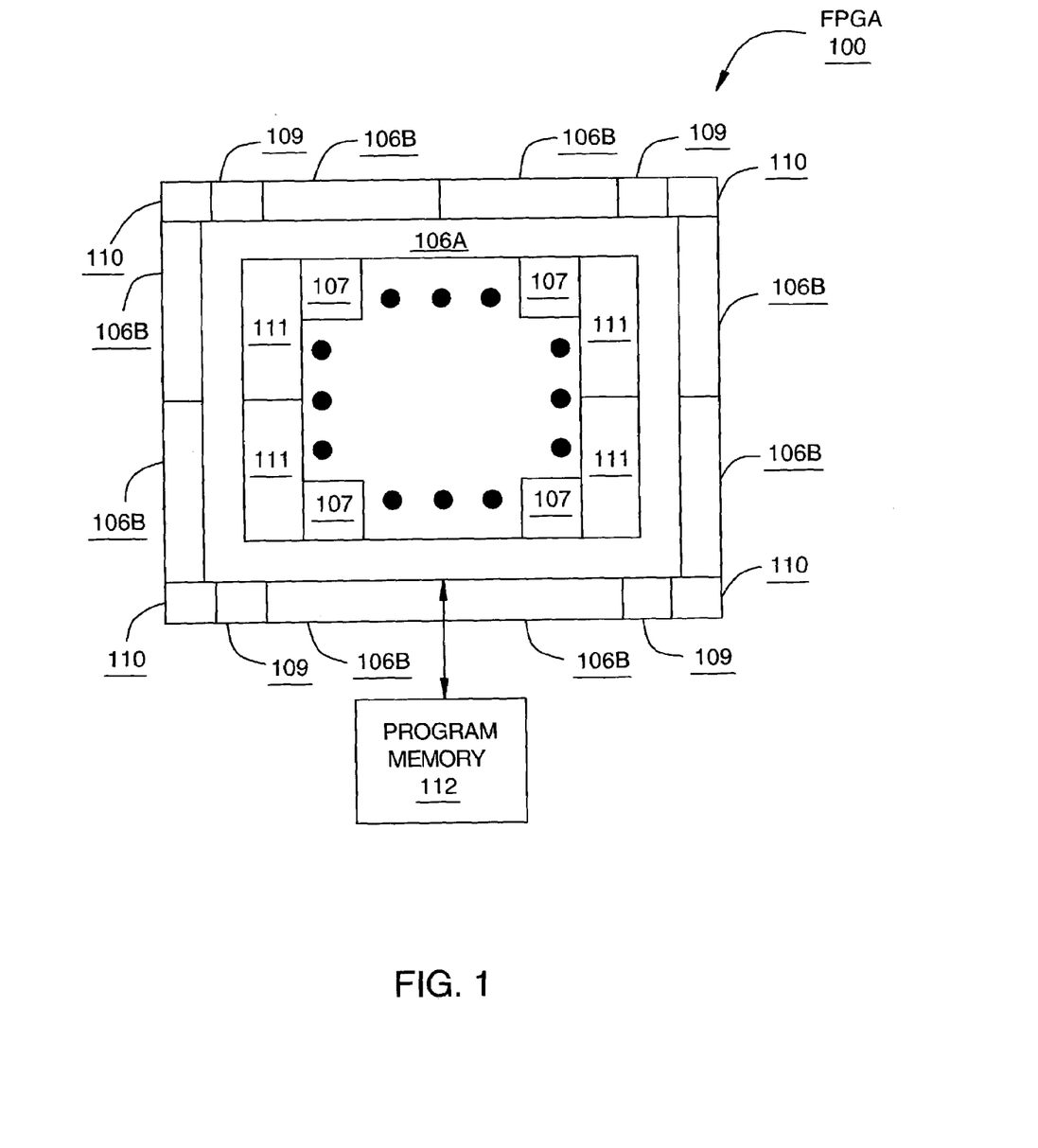
FIG. 1 depicts a block diagram of an exemplary embodiment of an FPGA in accordance of one or more aspects of the invention.

FIG. 1 depicts a block diagram of an exemplary embodiment of an FPGA 100 in accordance of one or more aspects of the invention coupled to a program memory 112. FPGA 100 illustratively includes CLBs 107, I/O routing ring 106A, memory 111, such as random access memory, delay lock loop (DLL) blocks 109, multiply/divide/de-skew clock circuits 110, and programmable IOBs 106B. DLL blocks 109 and clock circuits 110 collectively provide well-known digital clock management (DCM) circuits for managing clock signals within FPGA 100. Those skilled in the art understand that FPGA 100 may include other types of logic blocks and circuits in addition to those described herein.

As is well known in the art, CLBs 107 are programmably connectable by I/O routing ring 106A to perform various types of logic functions. Each of CLBs 107 may include one or more "slices" (not shown). Each CLB slice in turn includes various circuits, such as flip-flops, function generators (e.g., a look-up tables (LUTs)), logic gates, memory, and like type well known circuits. CLBs 107 receive clock signals from clock circuits 110 in a well known manner.

Programmable IOBs 106B are configured to provide input to, and receive output from, one or more of CLBs 107. Configuration information for CLBs 107, I/O routing ring 106A, and programmable IOBs 106B is stored in memory 111. Briefly stated, a configuration bitstream produced from program memory 112 is coupled to a configuration port of FPGA 100 to implement a desired circuit therein. The configuration process of FPGA 100 is also well known in the art.

Figure 2:
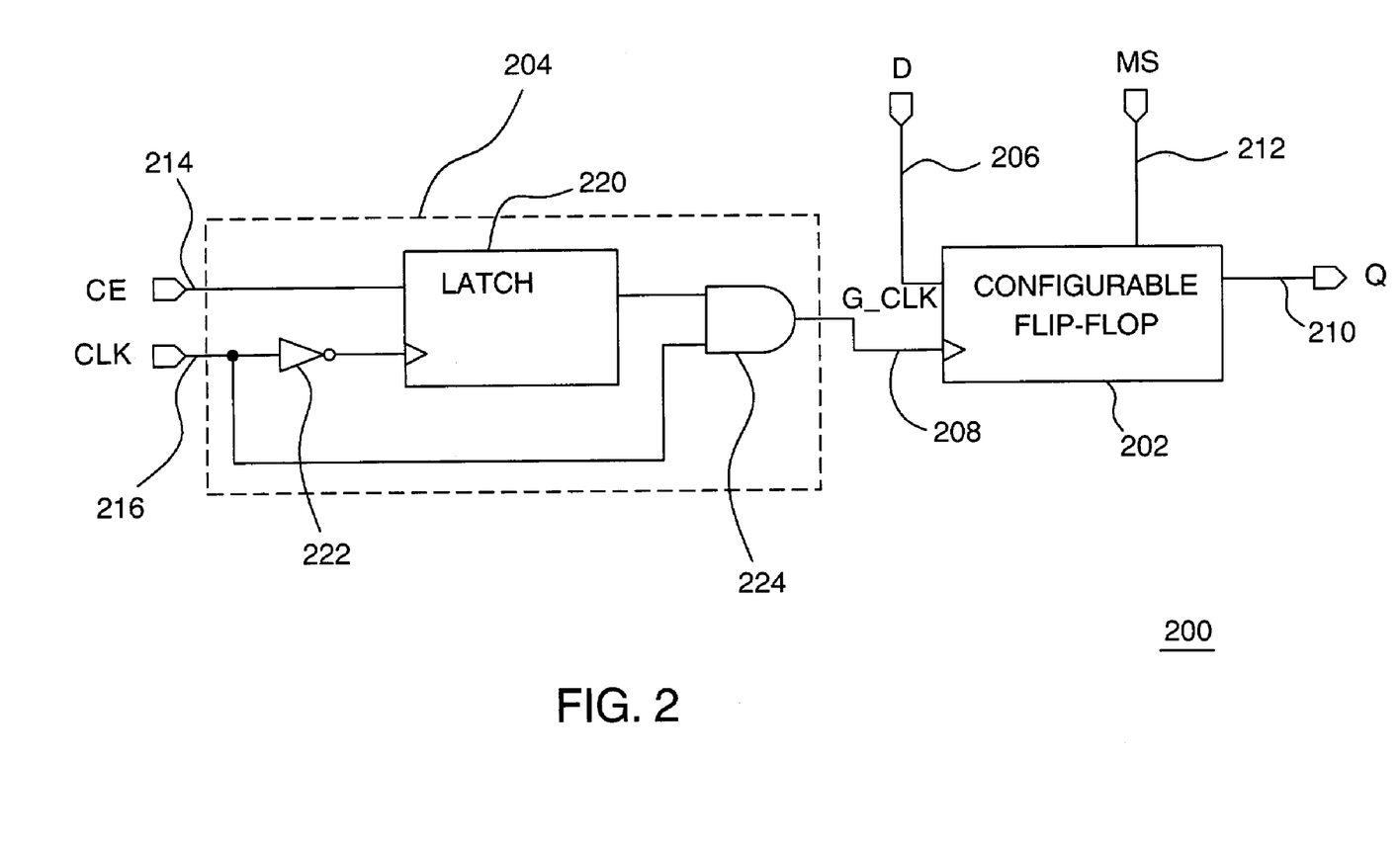
FIG. 2 depicts a high-level block diagram showing an exemplary embodiment of a synchronously gated configurable flip-flop in accordance with one or more aspects of the invention.

FIG. 2 depicts a high-level block diagram showing an exemplary embodiment of a synchronously gated configurable flip-flop 200 in accordance with one or more aspects of the invention. Synchronously gated configurable flip-flop 200 includes a configurable flip-flop 202 coupled to a synchronous clock gate 204. Configurable flip-flop 202 includes an input terminal D 206, a gated clock terminal G_CLK 208, an output terminal Q 210, and a configuration terminal MS 212. Synchronous clock gate 204 includes a clock enable terminal CE 214 and a clock terminal CLK 216. Synchronous clock gate 204 is coupled to gated clock terminal G_CLK 208. To avoid confusion, signals described herein are referred to with the same identifier as their respective terminals. For example, gated clock terminal G_CLK is driven with a gated clock signal G_CLK.

Synchronously gated configurable flip-flop 200 may be used within one or more logic blocks of a programmable logic device. For example, synchronously gated configurable flip-flop 200 may be employed within CLBs 107 of FPGA 100 shown in FIG. 1. When employed within FPGA 100, clock terminal CLK 216 is coupled to clock circuits 110 for receiving a clock signal. Configuration terminal is coupled to a memory cell within memory 111 for configuring synchronously gated configurable flip-flop 200 as described in additional detail below.

In operation, synchronous clock gate 204 controllably provides gated clock signal G_CLK to configurable flip-flop 202 in accordance with clock enable signal CE. If clock enable signal CE is in an logical low state, synchronous clock gate 204 gates clock signal CLK such that gated clock signal G_CLK remains in a steady state (i.e., gate clock signal G_CLK does not follow clock signal CLK). If clock enable signal CE is in an logical high state, synchronous clock gate 204 propagates clock signal CLK to gated clock terminal G_CLK. That is, gated clock signal G_CLK is latched to or follows clock signal CLK.

In addition, configurable flip-flop 202 controllably operates in either a single edge triggered (SET) mode or a dual edge triggered (DET) mode in accordance with configuration signal MS. If configuration signal MS is in a first state, configurable flip-flop 202 triggers on a single edge of gated clock signal G_CLK (i.e., either the rising or falling edge of gated clock signal G_CLK). Thus, output signal Q is latched to input signal D with each rising or falling edge of gated clock signal G_CLK. If configuration signal MS is in a second state, configurable flip-flop 202 triggers on both edges of gated clock signal G_CLK. Thus, output signal Q is latched to input signal D with each edge of gated clock signal G_CLK (i.e., both positive and negative edges of gate clock signal G_CLK).

Synchronously gated configurable flip-flop 200 provides reduced power consumption. For example, synchronously gated configurable flip-flop 200 may be used in one or more logic blocks of a PLD to reduce power consumption therein. A DET flip-flop can perform the same function as a SET flip-flop using a lower frequency clock signal. An SET flip-flop, however, exhibits lower switching activity within the internal nodes. Thus, in some cases a DET flip-flop provides reduced power consumption over an SET flip-flop, and in other cases an SET flip-flop provides reduced power consumption over a DET flip-flop. Synchronously gated configurable flip-flop 200 may be dynamically configured to operate in either SET or DET mode depending on which mode consumes the least amount of power in a particular configuration. Using synchronously gated configurable flip-flop 200 within one or more logic blocks of a PLD allows a designer to avoid using other logic circuitry within the PLD to construct a DET flip-flop.

In addition, synchronously gated configurable flip-flop 200 may be used to reduce power consumption by gating a clock signal coupled thereto. For example, synchronously gated configurable flip-flop 200 may be inactive by design during a particular operation within a PLD. Using synchronously gated configurable flip-flop 200 within one or more logic blocks of a PLD allows a designer to avoid using other logic circuitry to externally gate the clock signal. As known in the art, externally gating the clock signal to a logic device such as a flip-flop can cause a duty cycle change within the clock signal.

Synchronously gated configurable flip-flop 200 gates a clock signal input to flip-flop 200, rather than deactivating an input signal on input terminal D 206 using, for example, a data recirculation multiplexer. Gating a clock signal input to flip-flop 200 reduces dynamic power dissipation when compared to disabling logic in the form of a data recirculation multiplexer. A flip-flop consumes significantly more power with an active clock and an inactive data input than a flip-flop with an inactive or gated clock.

Figure 7:
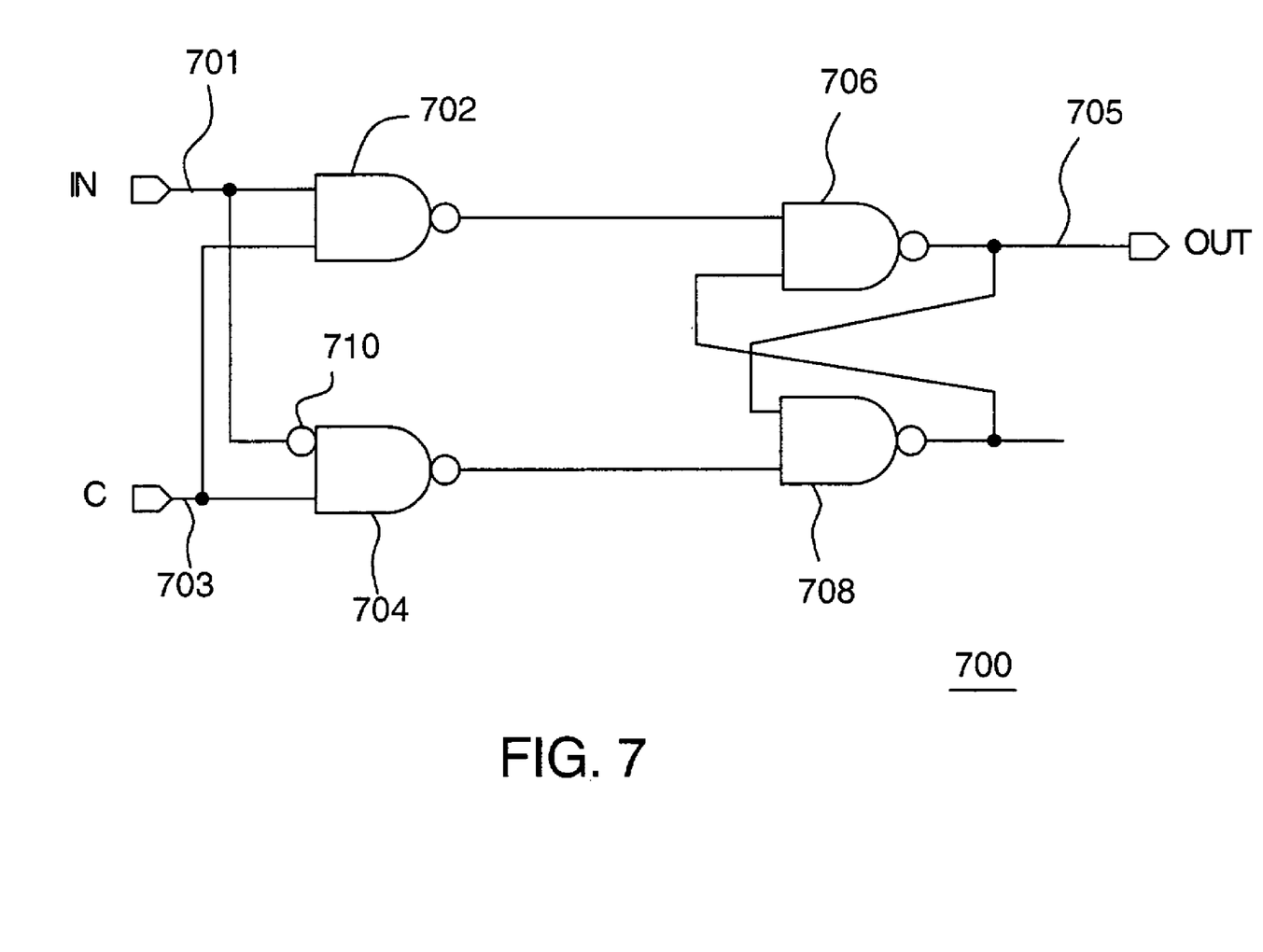
FIG. 7 depicts a schematic diagram showing an exemplary embodiment of a latch that may be used with the circuits of FIGS. 2, 3, and 5 in accordance with one or more aspects of the invention.

In an embodiment, synchronous clock gate-204 includes a latch 220, an inverter 222, and an AND gate 224. FIG. 7 depicts a schematic diagram showing an exemplary embodiment of a latch 700 that may be used as latch 220 in accordance with one or more aspects of the invention. Latch 700 includes an input terminal IN 701, a clock terminal C 703, an output terminal OUT 705, and NAND gates 702 through 708. NAND gate 702 is coupled to input terminal IN 702 and clock terminal C 703. NAND gate 704 is coupled to clock terminal C 703, and input terminal IN 701 through an inverter 710. NAND gate 706 is coupled to NAND gate 702 and an output of NAND gate 708. NAND gate 708 is coupled to NAND gate 704 and an output of NAND gate 706. In operation, output signal OUT is latched to input signal IN responsive to a rising edge of clock signal C. Those skilled in the art that other well-known latch configurations may be used with the invention latching the output signal to the input signal on either the positive or negative edge of a clock signal.

With renewed reference to FIG. 2, latch 220 is coupled to clock enable terminal CE 214, and clock terminal CLK 216 through output of inverter 222. AND gate 224 is coupled to output of latch 220 and clock terminal CLK 216. Output of AND gate 224 is coupled to gated clock terminal G_CLK 208. In operation, latch 220 is transparent low with respect to clock signal CLK. That is, latch 220 propagates clock enable signal CE to AND gate 224 when clock signal CLK is low, which because of inverter 222 means that clock signal CLK is high. If clock enable signal CE is in a logically high state, output of AND gate 224 cycles with clock signal CLK, and thus AND gate 224 effectively propagates clock signal CLK. Thus, gated clock signal G_CLK is latched to clock signal CLK. If clock enable signal CE is in a logically low state, AND gate 224 outputs a logically low signal. Thus, gated clock signal G_CLK is driven with a logically low signal. As such, flip-flop 200 draws less power in its inactive state. While synchronous clock gate 204 is shown as including AND gate 224, those skilled in the art will appreciate that other types and combinations of logic gates may be used within synchronous clock gate 204, such as NAND gates, NOR gates, OR gates, and the like.

Figure 3:
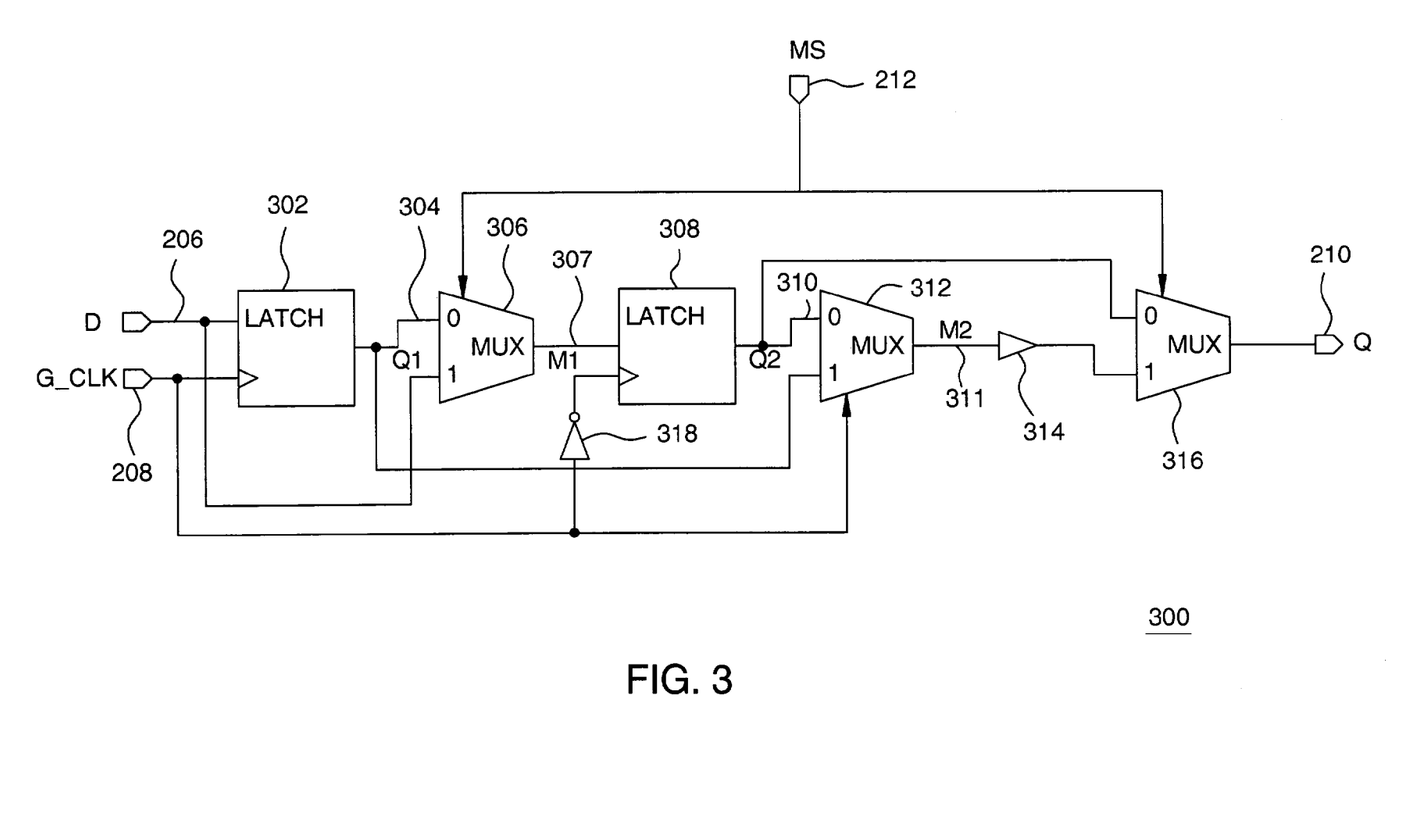
FIG. 3 depicts a schematic diagram showing an exemplary embodiment of a configurable flip-flop in accordance with one or more aspects of the invention.

FIG. 3 depicts a schematic diagram showing an exemplary embodiment of a configurable flip-flop 300 in accordance with one or more aspects of the invention. Configurable flip-flop 300 may be used as configurable flip-flop 202 shown in FIG. 2 and is described within this context. As such, elements of FIG. 3 that are the same or similar to elements of FIG. 2 are designated with identical reference numerals and are described in detail above. Configurable flip-flop 300 includes latches 302 and 308, and multiplexers 306, 312, and 316.

In particular, inputs of latch 302 are respectively coupled to input terminal D 206 and gated clock terminal G_CLK 208. Latch 302 includes an output terminal Q1 304. Inputs of multiplexer 306 are respectively coupled to output terminal Q1 304 and input terminal D 206. Multiplexer 306 is coupled to configuration terminal MS 212 at a control/select input terminal of multiplexer 306. Multiplexer 306 includes an output terminal M1 307. A non-complemented input of latch 308 is coupled to output terminal M1 307, and a complemented input of latch 308 is coupled to gated clock terminal G_CLK 208 through output of an inverter 318. Latch 308 includes an output terminal Q2 310. Inputs of multiplexer 312 are respectively coupled to output terminal Q2 310 and output terminal Q1 304. Multiplexer 312 is coupled to gated clock terminal G_CLK 208 at a control/select input terminal of multiplexer 312. Multiplexer 312 includes an output terminal M2 311. An input of multiplexer 316 is coupled to output terminal Q2 310, and another input of multiplexer 316 is coupled to output terminal M2 311 through output of a buffer 314. Multiplexer 316 is coupled to configuration terminal MS 212 at a control/select input terminal of multiplexer 316. An output of multiplexer 316 is coupled to output terminal Q 210.

Latch 302 is transparent high with respect to gated clock signal G_CLK (i.e., latch 302 propagates input signal D to output terminal Q1 304 when gated clock signal G_CLK is high). If configuration signal MS is logically low, multiplexer 306 propagates output signal Q1 to output terminal M1 307. If configuration signal MS is logically high, multiplexer 306 propagates input signal D to output terminal M1 307. Latch 308 is transparent low with respect to gated clock signal G_CLK (i.e., latch 308 propagates output signal M1 to output terminal Q2 310 when gated clock signal G_CLK is low). If gated clock signal G_CLK is low, multiplexer 312 propagates output signal Q2 to output terminal M2 311. If gated clock signal G_CLK is high, multiplexer 312 propagates output signal Q1 to output terminal M2 311. If configuration signal MS is low, multiplexer 316 propagates output signal Q2 to output terminal Q 210. If configuration signal MS is high, multiplexer 316 propagates output signal M2 to output terminal Q 210.

Figure 4:
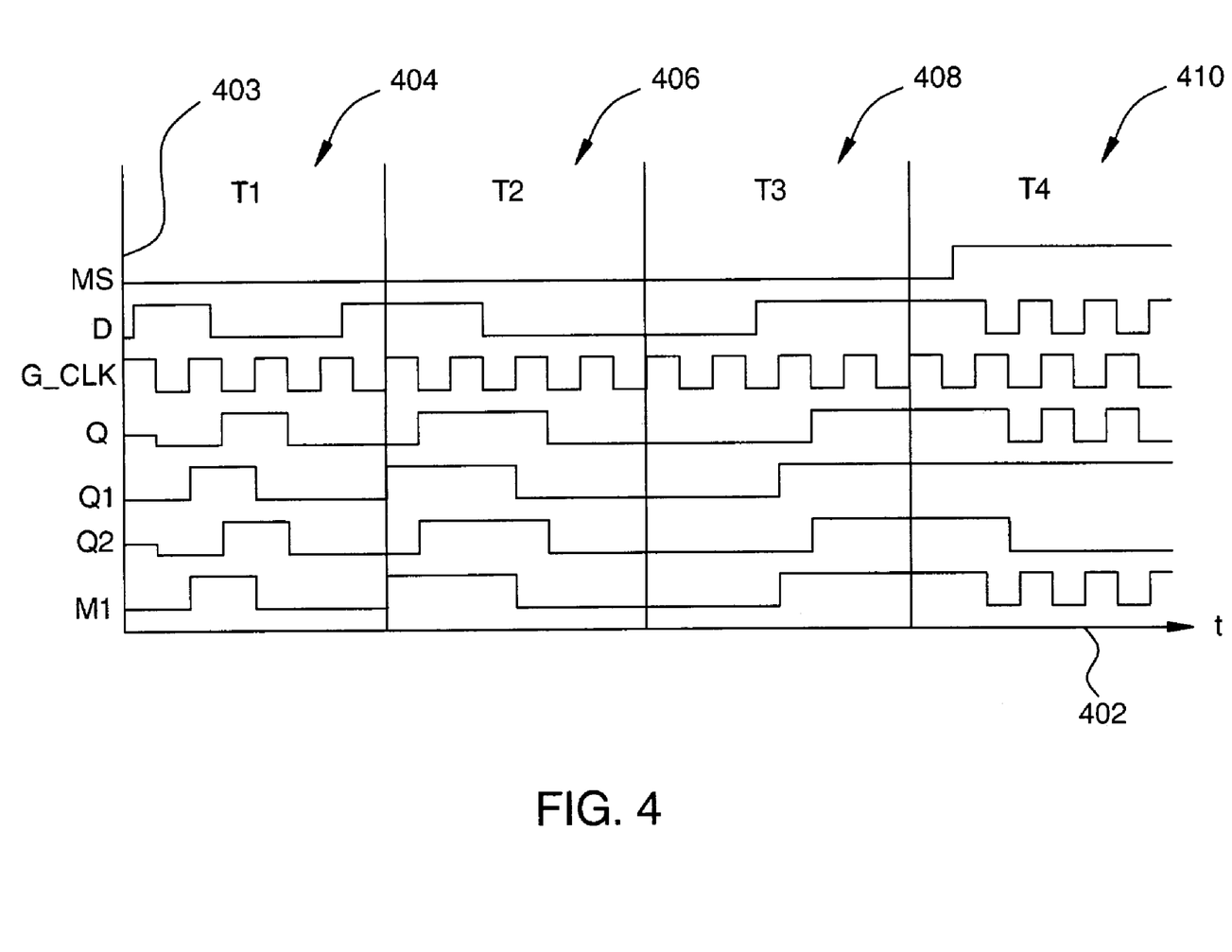
FIG. 4 depicts a waveform diagram showing an exemplary embodiment of signals within the configurable flip-flop of FIG. 3 in accordance with one or more aspects of the invention.

FIG. 4 depicts a waveform diagram showing an exemplary embodiment of signals within configurable flip-flop 300 in accordance with one or more aspects of the invention. Axis 402 represents time over four intervals T1 404, T2 406, T3 408, and T4 410. Exemplary waveforms for configuration signal MS, input signal D, gated clock signal G_CLK, output signal Q, output signal Q1, output signal Q2, and output signal M1 are shown along axis 403.

Operation of configurable flip-flop 300 can be understood with simultaneous reference to FIGS. 3 and 4. In the present example, configuration signal MS is logically low during intervals T1 404, T2 406, and T3 408. If configuration signal MS is logically low, configurable flip-flop 300 functions in a SET mode. Thus, output signal Q is latched to input signal D on each rising edge of gated clock signal G_CLK delayed by one-half clock cycle. In particular, output signal Q1 is latched to input signal D on each rising edge of gated clock signal G_CLK. Output signal M1 from multiplexer 306 follows output signal Q1. Output signal Q2 is latched to output signal Q1 (through multiplexer 306) on each falling edge of gated clock signal G_CLK. Output signal M2 from multiplexer 312 does not leave configurable flip-flop 300, since multiplexer 316 selects output signal Q2 as output signal Q.

Configuration signal MS is logically high during interval T4 410. If configuration signal MS is logically high, configurable flip-flop 300 functions in DET mode. Thus, output signal Q is latched to input signal D on both rising and falling edges of gated clock signal G_CLK. In particular, output signal Q1 continues to be latched to input signal D on each rising edge of gated clock signal G_CLK. Output signal M1 from multiplexer 306, however, now follows input signal D. As such, output signal Q2 is latched to input signal D on each falling edge of gated clock signal G_CLK. Multiplexer 312 selects output signal Q2 when gated clock signal G_CLK is low and output signal Q1 when gated clock signal G_CLK is high. Multiplexer 316 now selects output signal M2 from multiplexer 312 as output signal Q. Accordingly, it should be appreciated that flip-flop 300 may be dynamically configured for SET or DET operation.

Figure 5:
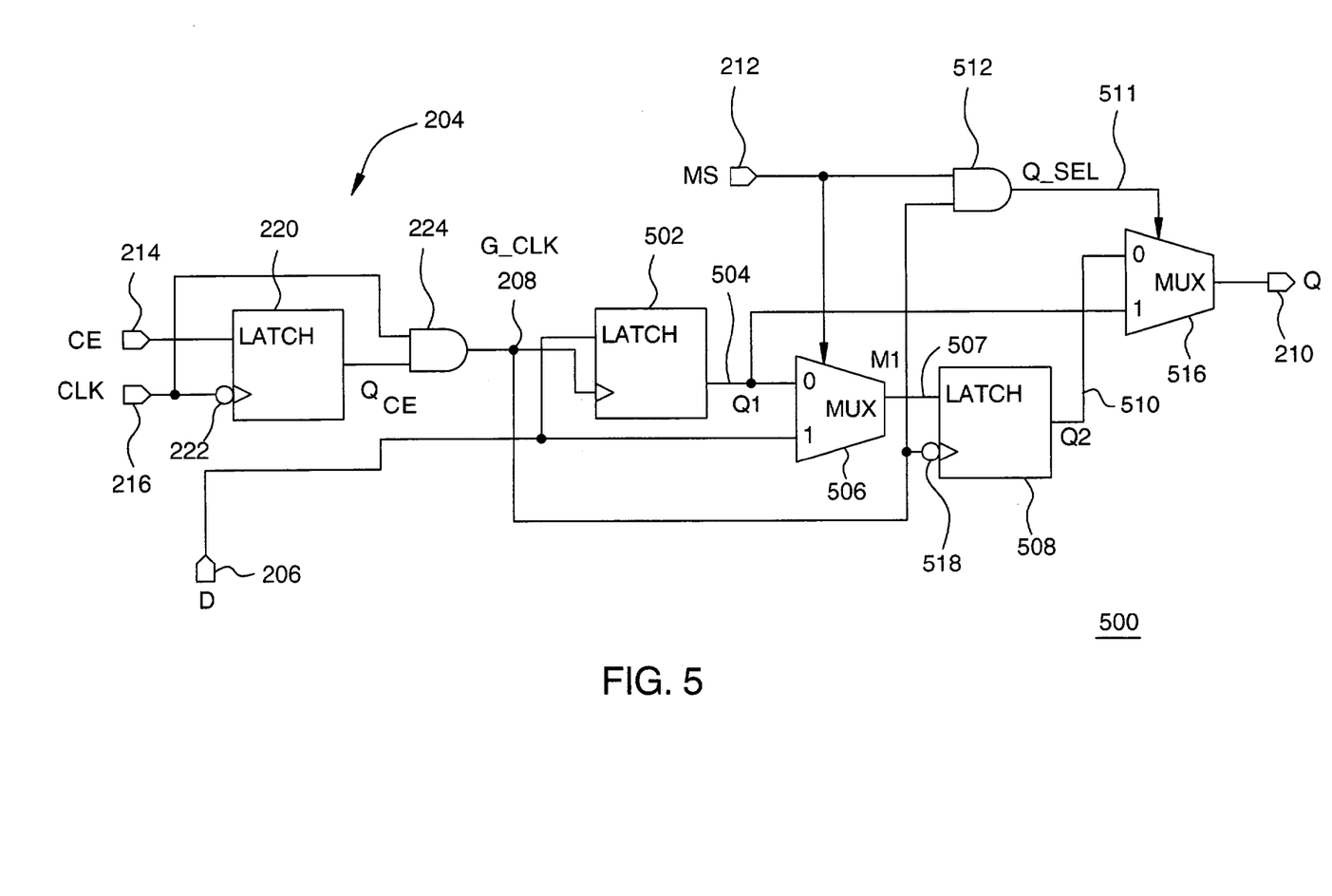
FIG. 5 depicts a more detailed schematic diagram showing another exemplary embodiment of synchronously gated configurable flip-flop in accordance with one or more aspects of the invention.

FIG. 5 depicts a more detailed schematic diagram showing another exemplary embodiment of synchronously gated configurable flip-flop 500 in accordance with one or more aspects of the invention. Elements in FIG. 5 that are the same or similar to elements of FIG. 2 are designated with identical reference numerals and are described in detail above. Synchronously gated configurable flip-flop 500 includes synchronous gate 204, latches 502 and 508, multiplexers 506 and 516, and AND gate 512.

In particular, inputs of latch 502 are respectively coupled to input terminal D 206 and gated clock terminal G_CLK 208. Latch 502 includes an output terminal Q1 504. Inputs of multiplexer 506 are respectively coupled to output terminal Q1 504 and input terminal D 206. Multiplexer 506 is coupled to configuration terminal MS 212 at a control/select terminal of multiplexer 506. Multiplexer 506 includes an output terminal M1 507. A non-complemented input of latch 508 is coupled to output terminal M1 507, and a complemented input of latch 508 is coupled to gated clock terminal G_CLK 208 through output of an inverter 518. Latch 508 includes an output terminal Q2 510. Inputs of AND gate 512 are respectively coupled to configuration terminal MS 212 and gated clock terminal G_CLK 208. AND gate 512 includes an output terminal Q_SEL 511. Inputs of multiplexer 516 are respectively coupled to output terminal Q2 510 and output terminal Q1 504. Multiplexer 516 is coupled to output terminal Q_SEL 511 at a control/select terminal of multiplexer 516. An output of multiplexer 516 is coupled to output terminal Q 210.

Latch 502 is transparent high with respect to gated clock signal G_CLK (i.e., latch 502 propagates input signal D to output terminal Q1 504 when gated clock signal G_CLK is high). If configuration signal MS is logically low, multiplexer 506 propagates output signal Q1 to output terminal M1 507. If configuration signal MS is logically high, multiplexer 506 propagates input signal D to output terminal M1 507. Latch 508 is transparent low with respect to gated clock signal G_CLK (i.e., latch 508 propagates output signal M1 to output terminal Q2 510 when gated clock signal G_CLK is low). If configuration signal MS is logically low, output signal Q_SEL is also logically low. If configuration signal MS is logically high, output signal Q_SEL follows gated clock signal G_CLK. If output signal Q_SEL is logically low, multiplexer 516 propagates output signal Q2 to output terminal Q 210. If output signal Q_SEL is logically high, multiplexer 516 propagates output signal Q1 to output terminal Q 210.

Figure 6:
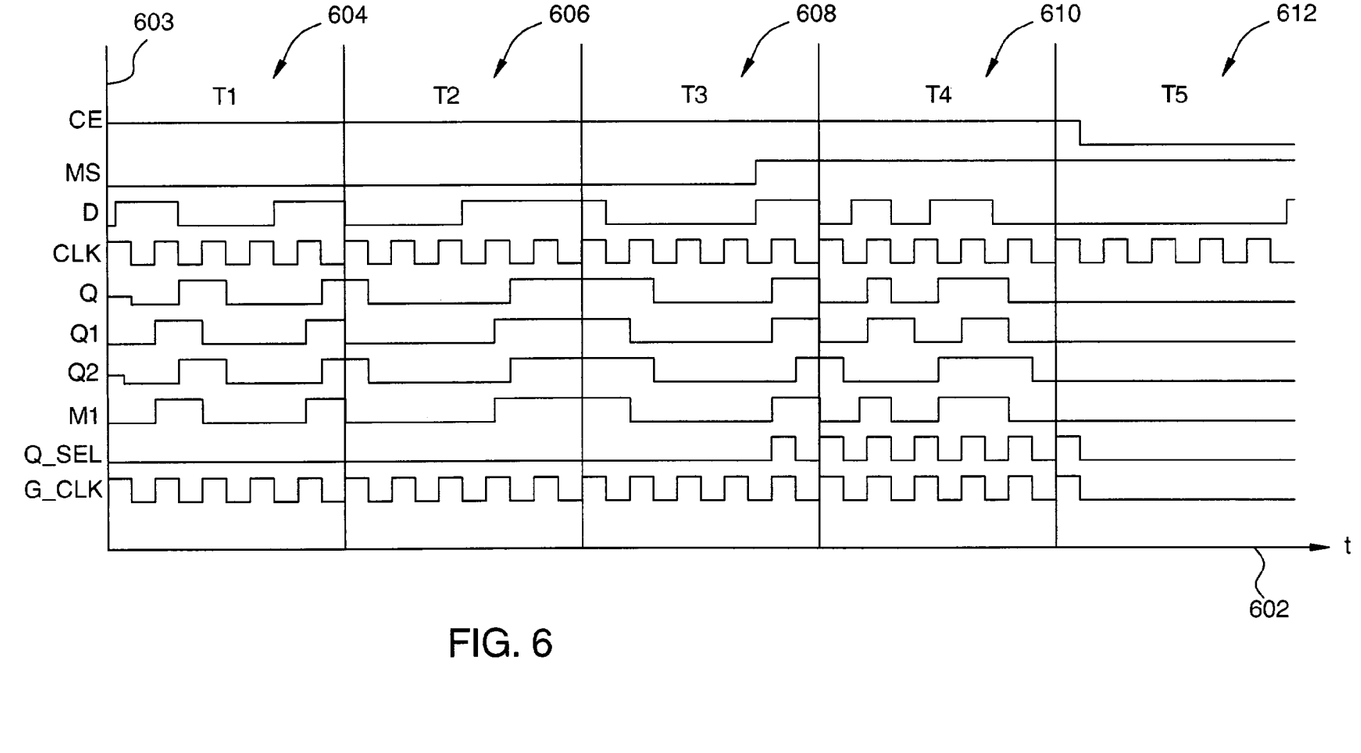
FIG. 6 depicts a waveform diagram showing an exemplary embodiment of signals within the synchronously gated configurable flip-flop of FIG. 5 in accordance with one or more aspects of the invention.

FIG. 6 depicts a waveform diagram showing an exemplary embodiment of signals within synchronously gated configurable flip-flop 500 in accordance with one or more aspects of the invention. Axis 602 represents time over five intervals T1 604, T2 606, T3 608, T4 610, and T5 612. Exemplary waveforms for clock enable signal CE, configuration signal MS, input signal D, clock signal CLK, output signal Q, output signal Q1, output signal Q2, output signal M1, output signal Q_SEL, and gated clock signal G_CLK are depicted along axis 603.

Operation of synchronously gated configurable flip-flop 500 can be understood with simultaneous reference to FIGS. 5 and 6. In the present example, clock enable signal CE is logically high during intervals T1 604, T2 606, T3 608, and T4 610. If clock enable signal CE is logically high, AND gate 224 drives gated clock terminal G_CLK 208 with clock signal CLK. Thus, gated clock signal G_CLK is latched to clock signal CLK.

Also in the present example, configuration signal MS is logically low during intervals T1 604 and T2 606. If configuration signal MS is logically low and clock enable signal CE is logically high, synchronously gated configurable flip-flop 500 functions in a SET mode. Thus, output signal Q is latched to input signal D on each rising edge of clock signal CLK delayed by one-half clock cycle. In particular, output signal Q1 is latched to input signal D on each rising edge of clock signal CLK. Output signal M1 from multiplexer 306 follows output signal Q1. Output signal Q2 is latched to output signal Q1 (through multiplexer 506) on each falling edge of clock signal CLK. Output signal Q_SEL is logically low as long as configuration signal MS is logically low. Thus, multiplexer 508 propagates output signal Q2 to output terminal Q 210.

Configuration signal MS is logically high during intervals T3 608, T4 610, and T5 612. If configuration signal MS is logically high and clock enable signal CE is logically high, synchronously gated configurable flip-flop 500 functions in DET mode. Thus, output signal Q is latched to input signal D on each rising edge and each falling edge of clock signal CLK. In particular, output signal Q1 continues to be latched to input signal D on each rising edge of clock signal CLK. Output signal M1 from multiplexer 506, however, now follows input signal D. As such, output signal Q2 is latched to input signal D on each falling edge of clock signal CLK. Output signal Q_SEL now follows clock signal CLK. Multiplexer 516 selects output signal Q2 when clock signal CLK is low and output signal Q1 when clock signal CLK is high.

If clock enable signal CE is logically low, gated clock signal G_CLK is logically low. As such, synchronously gated configurable flip-flop 500 does not receive a clock signal on gated clock terminal G_CLK 208 (i.e., clock signal CLK is gated). As such, all signals within synchronously gated configurable flip-flop 500 remain in their previous states. Accordingly, it should be appreciated that flip-flop 500 may be dynamically configured for SET or DET operation to reduce power consumption. In addition, a clock signal input to flip-flop 500 may be dynamically gated to reduce power consumption.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. A logic device for reducing power consumption, comprising:
   a clock gate having a clock enable terminal and a clock terminal; and
   a flip-flop coupled to the clock gate, the flip-flop having an input terminal, an output terminal, and a configuration terminal, the flip-flop configured to trigger on at least one of a rising edge and a falling edge of a clock signal provided to the clock terminal;
   wherein output from the clock gate is synchronous with the clock signal and follows the clock signal when a clock enable signal is in a first state and is logically low when the clock enable signal is in second state; and
   wherein the flip-flop comprises:
      a first latch coupled to the input terminal and the clock gate:
      a first multiplexer coupled to the first latch, the input terminal, and the configuration terminal:
      a second latch coupled to the first multiplexer and the clock gate; and
      a second multiplexer coupled to the first latch, the second latch, and the clock gate.

2. The logic device of claim 1, wherein the clock gate controllably gates the clock signal responsive to the clock enable signal provided to the clock enable terminal.

3. The logic device of claim 1, wherein the flip-flop controllably triggers on a selected one of the rising edge, the falling edge, and both the rising edge and the falling edge of the clock signal, responsive to a configuration signal provided to the configuration terminal.

4. The logic device of claim 1, wherein the flip-flop comprises:
a third multiplexer coupled to the second latch, the second multiplexer, and the configuration terminal.

5. The logic device of claim 1, wherein the clock gate comprises:
a first latch coupled to the clock enable terminal and the clock terminal; and
a first logic gate coupled to the first latch and the clock terminal.

6. The logic device of claim 5, wherein the logic gate is an AND gate.

7. The logic device of claim 5, wherein the flip-flop comprises:
a second latch coupled to the input terminal and the first logic gate;
a first multiplexer coupled to the second latch, the input terminal, and the configuration terminal;
a third latch coupled to the first multiplexer, and the first logic gate;
a second logic gate coupled to the configuration terminal and the first logic gate; and
a second multiplexer coupled to the third latch, the second latch, and the second logic gate.

8. The logic device of claim 7, wherein the second logic gate is an AND gate.

9. In a programmable logic device (PLD) having a plurality of logic blocks, an apparatus for reducing power consumption within the PLD comprising:
at least one flip-flop disposed in at least one of the plurality of logic blocks, the at least one flip-flop comprising:
a clock terminal;
a data input terminal;
a data output terminal;
a configuration terminal; and
a synchronous clock gate having a clock enable terminal, the synchronous clock gate receiving a clock signal and outputting a gated clock signal;
where the at least one flip-flop is configured to trigger on a selected one of a rising edge of the gated clock signal, a falling edge of the gated clock signal, and both the rising edge and the falling edge of the gated clock signal, and where the gated clock signal follows the clock signal when a clock enable signal coupled to the clock enable terminal of the synchronous clock gate is in a first state and is logically low when the clock enable signal is in a second state; and
wherein the flip-flop comprises:
a first latch coupled to the input terminal and the clock gate:
a first multiplexer coupled to the first latch, the input terminal, and the configuration terminal;
a second latch coupled to the first multiplexer and the clock gate; and
a second multiplexer coupled to the first latch, the second latch, and the clock gate.

10. The apparatus of claim 9, wherein the clock terminal is coupled to a clock circuit within the PLD.

11. The apparatus of claim 9, wherein the flip-flop controllably triggers on the selected one of the rising edge, the falling edge, and both the rising edge and the falling edge of the clock signal, responsive to a configuration signal coupled to the configuration terminal.

12. The apparatus of claim 11, wherein the configuration terminal is coupled to a memory cell within the PLD.

13. The apparatus of claim 9, wherein the flip-flop further comprises:
a third multiplexer coupled to the second latch, the second multiplexer, and the configuration terminal.

14. A method of reducing power consumption within a programmable logic device (PLD), comprising:
providing a flip-flop in at least one of a plurality of logic blocks within the PLD;
coupling a clock signal to the flip-flop;
coupling a configuration signal to the flip-flop;
configuring the flip-flop responsive to the configuration signal to trigger on a selected one of a rising edge, a falling edge, and both the rising edge and the falling edge of the clock signal; and
synchronously gating the clock signal responsive to a clock enable signal, wherein the clock signal is running when the clock enable signal is in a first state and is logically low when the clock enable signal is in a second state; and
wherein the flip-flop comprises:
a first latch coupled to the input terminal and the clock gate;
a first multiplexer coupled to the first latch, the input terminal, and the configuration terminal;
a second latch coupled to the first multiplexer and the clock gate; and
a second multiplexer coupled to the first latch, the second latch, and the clock gate.

15. The method of claim 14, further comprising:
changing configuration of the flip-flop during operation responsive to a change in the configuration signal.

* * * * *